United States Patent
Yoon et al.

(10) Patent No.: US 9,425,214 B2
(45) Date of Patent: Aug. 23, 2016

(54) THIN FILM TRANSISTOR SUBSTRATE, METHOD OF MANUFACTURING THE SAME, AND ORGANIC LIGHT EMITTING DIODE DISPLAY USING THE SAME

(71) Applicant: Samsung Display Co., Ltd., Yongin, Gyeonggi-do (KR)

(72) Inventors: Young Sik Yoon, Yongin (KR); Youn Joon Kim, Yongin (KR); Seung Peom Noh, Yongin (KR); Sang Jo Lee, Yongin (KR); Ji Won Han, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 18 days.

(21) Appl. No.: 14/087,233

(22) Filed: Nov. 22, 2013

(65) Prior Publication Data
US 2015/0021607 A1  Jan. 22, 2015

(30) Foreign Application Priority Data
Jul. 19, 2013 (KR) ........................ 10-2013-0085516

(51) Int. Cl.
| | | |
|---|---|---|
| H01L 29/786 | (2006.01) | |
| H01L 27/32 | (2006.01) | |
| H01L 21/28 | (2006.01) | |
| H01L 27/12 | (2006.01) | |
| H01L 21/02 | (2006.01) | |
| H01L 21/268 | (2006.01) | |
| H01L 51/00 | (2006.01) | |
| H01L 51/52 | (2006.01) | |

(52) U.S. Cl.
CPC ...... *H01L 27/1218* (2013.01); *H01L 21/02532* (2013.01); *H01L 21/02686* (2013.01); *H01L 27/1262* (2013.01); *H01L 21/268* (2013.01); *H01L 27/3244* (2013.01); *H01L 51/0097* (2013.01); *H01L 51/5253* (2013.01)

(58) Field of Classification Search
CPC . H01L 29/786; H01L 29/78603; H01L 21/28; H01L 27/3244; H01L 51/50; H01L 51/52; H01L 51/5203
See application file for complete search history.

(56) References Cited

U.S. PATENT DOCUMENTS

| | | | |
|---|---|---|---|
| 6,716,664 B2 | 4/2004 | Machida et al. | |
| 2006/0009014 A1 | 1/2006 | Kim et al. | |
| 2007/0138941 A1* | 6/2007 | Jin ...................... H01L 27/3232 313/503 |
| 2011/0122330 A1* | 5/2011 | Tae et al. ......................... 349/39 |
| 2011/0156041 A1* | 6/2011 | An et al. ......................... 257/59 |

(Continued)

FOREIGN PATENT DOCUMENTS

| | | |
|---|---|---|
| JP | 4579054 | 9/2010 |
| KR | 10-0270315 | 7/2000 |

(Continued)

*Primary Examiner* — Whitney T Moore
(74) *Attorney, Agent, or Firm* — Knobbe Martens Olson & Bear LLP

(57) ABSTRACT

A thin film transistor substrate includes: a polymer substrate, an oxide transparent electrode layer (TCO) formed on the polymer substrate, a barrier layer formed on the oxide transparent electrode layer, and a semiconductor layer formed on the barrier layer, in which the semiconductor layer is polysilicon. The polysilicon thin film transistor provides an oxide transparent electrode layer (TCO) which absorbs heat energy and light generated during a process of manufacturing the polysilicon thin film transistor to prevent a damage of the substrate using a polymer material.

14 Claims, 6 Drawing Sheets

(56) References Cited

U.S. PATENT DOCUMENTS

| | | |
|---|---|---|
| 2013/0037804 A1 | 2/2013 | Lee et al. |
| 2013/0314633 A1* | 11/2013 | Koo .................... H01L 51/5203 349/41 |
| 2014/0246711 A1* | 9/2014 | Amari .................... H01L 27/124 257/288 |
| 2014/0306213 A1* | 10/2014 | Sato et al. ....................... 257/40 |

FOREIGN PATENT DOCUMENTS

| | | |
|---|---|---|
| KR | 10-0795323 | 1/2008 |
| KR | 10-2008-0098978 | 11/2008 |
| KR | 10-0890250 | 3/2009 |
| KR | 10-2010-0027526 | 3/2010 |
| KR | 10-2012-0073904 | 7/2012 |

* cited by examiner

# THIN FILM TRANSISTOR SUBSTRATE, METHOD OF MANUFACTURING THE SAME, AND ORGANIC LIGHT EMITTING DIODE DISPLAY USING THE SAME

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This application claims priority to and the benefit of Korean Patent Application No. 10-2013-0085516 filed in the Korean Intellectual Property Office on Jul. 19, 2013, the entire contents of which are incorporated herein by reference.

BACKGROUND

1. Field

The present disclosure relates to a thin film transistor substrate, a method of manufacturing the same, and an organic light emitting diode display using the same.

2. Description of the Related Technology

Transistors used in flexible displays include amorphous silicon-based thin film transistors for glass-based liquid crystal displays. For organic light emitting displays, amorphous silicon-based thin film transistors, low temperature polysilicon (LTPS)-based thin film transistors representing polysilicon, or metal oxide-based thin film transistors that can be subjected to a low temperature process may be used.

The above information disclosed in this Background section is only for enhancement of understanding of the background of the invention and therefore it may contain information that does not form the prior art that is already known in this country to a person of ordinary skill in the art.

SUMMARY OF CERTAIN INVENTIVE ASPECTS

The present disclosure has been made in an effort to provide a thin film transistor substrate that can prevent damage to a polymer substrate even under a dehydrogenation process temperature condition by inserting an oxide transparent electrode layer into the thin film transistor substrate when an amorphous silicon-based thin film transistor is manufactured into a polysilicon-based thin film transistor, and a method of manufacturing the same.

One embodiment provides a thin film transistor substrate including: a polymer substrate, an oxide transparent electrode layer (TCO) formed on the polymer substrate, at least one barrier layer formed on the oxide transparent electrode layer, and a semiconductor layer formed on the barrier layer, in which the semiconductor layer comprises polysilicon.

The polymer substrate may include at least one of PC (polycarbonate), PET (polyethylene terephthalate), PEN (polyethylene naphthalate), PES (polyether sulfone), PMMA (polymethyl methacrylate), PAR (polyarylate), or PI (polyimide).

The polymer substrate may be a transparent or opaque substrate.

The polymer substrate may be applied on a glass plate.

A thickness of the polymer substrate may be about 10 to about 200 µm.

The oxide transparent electrode layer (TCO) may include at least one of ITO (indium tin oxide), IGZO (indium gallium zinc oxide), ZnO, graphene, or CNT (carbon nanotube).

The oxide transparent electrode layer (TCO) may be configured to absorb light and heat by a laser.

The barrier layer may be formed beneath an oxide transparent electrode instead of being formed on the oxide transparent electrode layer (TCO).

The barrier layer may be further formed beneath the oxide transparent electrode layer.

Another embodiment provides a method of manufacturing a thin film transistor substrate, including: applying a polymer substrate on a support, depositing an oxide transparent electrode layer on the polymer substrate, depositing a barrier layer on the oxide transparent electrode layer, forming amorphous silicon as the semiconductor layer on the barrier layer, and performing dehydrogenation treatment of the amorphous silicon and radiating a laser beam thereon.

The polymer substrate may be one kind selected from the group consisting of PC (polycarbonate), PET (polyethylene terephthalate), PEN (polyethylene naphthalate), PES (polyether sulfone), PMMA (polymethyl methacrylate), PAR (polyarylate), and PI (polyimide).

The oxide transparent electrode layer (TCO) may include at least one of ITO (indium tin oxide), IGZO (indium gallium zinc oxide), ZnO, graphene, or CNT (carbon nanotube).

The barrier layer may be formed beneath an oxide transparent electrode instead of being formed on the oxide transparent electrode layer (TCO).

The barrier layer may be further formed beneath the oxide transparent electrode layer.

The dehydrogenation treatment may be performed at a temperature of about 420 to about 550° C.

An excimer laser may be used as a laser for radiating the laser beam.

Yet another embodiment provides an organic light emitting diode display including: a polymer substrate, an oxide transparent electrode layer (TCO) formed on the polymer substrate, a thin film transistor formed on the oxide transparent electrode layer, a passivation layer formed on the thin film transistor, a first electrode formed on the passivation layer, an intermediate layer formed on the first electrode, and a second electrode formed on the intermediate layer.

As described above, a polysilicon thin film transistor according to embodiments has an oxide transparent electrode layer (TCO) which can absorb heat energy and light generated during a process of manufacturing the polysilicon thin film transistor to prevent a damage of a substrate using a polymer material.

DETAILED DESCRIPTION OF CERTAIN INVENTIVE EMBODIMENTS

Figure 1:
FIG. 1 is a schematic diagram of a cross-section of a thin film transistor substrate according to an embodiment.

Embodiments of the present invention will be described more fully hereinafter with reference to the accompanying drawings, in which certain embodiments of the invention are shown. As those skilled in the art would realize, the described embodiments may be modified in various ways, without departing from the spirit or scope of the present invention.

In the drawings, the thickness of layers, films, panels, regions, and the like, may be exaggerated for clarity. Like reference numerals generally designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In the case of an organic light emitting diode display, including a flexible organic light emitting diode display, a current driving type transistor is used, unlike a voltage driving type thin film transistor of a liquid crystal display, because of their driving principle. A polysilicon-based thin film transistor having high charge mobility is used, but since an element manufacturing process temperature of a general polysilicon-based thin film transistor is high, a typical polymer substrate causes high outgassing due to a characteristic of a plastic material itself. The outgassing may affect a thin film laminated on the polymer substrate to reduce a characteristic of the element, and an outgassed residue may remain in a chamber and the like during a process to cause contamination. Particularly, since a substrate material used in a flexible organic light emitting diode display has a high thermal expansion coefficient and low heat resistance, it is difficult to apply the substrate material. Accordingly, recently, a metal oxide-based thin film transistor known to have a relative low process temperature has been intensively examined, but, generally, reliability is low, and in the case where the element is manufactured at a temperature that is not sufficiently high, the characteristic of the element may be reduced.

In the case of the polysilicon-based thin film transistor represented as low temperature polysilicon, the polysilicon-based thin film transistor has high charge mobility and exhibits excellent reliability. However, in reviewing a process of manufacturing the low temperature polysilicon, since after amorphous silicon is deposited, a dehydrogenation process at a temperature of about 400 to 600° C. and the like is used, it is actually difficult to apply the process to a flexible display using the polymer substrate, and thus the low temperature polysilicon process is not used.

In order to smoothly perform the dehydrogenation process, a method of performing dehydrogenation using a laser and continuously using ELA is a crystallization process. However, in the case of the thin film transistor manufactured by this method, charge mobility is high but surface Mura and the like may occur due to element reliability and radiation of the laser several times, and thus a thin film transistor that can endure the temperature condition of the dehydrogenation process and the ELA process is desired.

A polysilicon thin film transistor according to an embodiment and a method of manufacturing the same will be described in detail with reference to the drawings.

FIG. 1 is a schematic diagram of a cross-section of the thin film transistor substrate according to an embodiment.

As illustrated in FIG. 1, the thin film transistor substrate according to an embodiment includes a polymer substrate 110, an oxide transparent electrode layer 112 formed on the polymer substrate 110, a barrier layer 111 formed on the oxide transparent electrode layer 112, and a semiconductor layer 151a formed on the barrier layer 111.

The polymer substrate 110 may be manufactured by being applied on a support (not illustrated), and a glass plate may be used as the support but the support is not limited thereto.

This structure help to prevent the polymer substrate from being damaged during a process in the case where an element including a thin film is formed on the polymer substrate 110, and, after the process of forming the element is finished, the support may be removed in the polymer substrate 110.

Hereinafter, constitution of each layer will be described in detail.

The polymer substrate 110 may be subjected to vacuum heat treatment at around a glass transition temperature in order to minimize deformation.

The polymer substrate 110 is in a flexible state, may include any one of PC (polycarbonate), PET (polyethylene terephthalate), PEN (polyethylene naphthalate), PES (polyether sulfone), PMMA (polymethyl methacrylate), PAR (polyarylate), and PI (polyimide).

The polyimide-based polymer has excellent mechanical strength and a maximum process feasible temperature of about 550° C. to secure excellent heat resistance as compared to other polymer materials, even though a predetermined heating process is performed in processes of the thin film transistor and the organic light emitting element, in which the element is formed on the substrate formed of polyimide, the polyimide-based polymer may stably act as the substrate of a flexible display device while not drooping by loads of the elements and the layers.

Either a transparent polymer substrate or an opaque polymer substrate may be used as the polymer substrate 110.

The polymer substrate 110 may be formed by a manner of applying, for example, a polymer resin solution on the glass plate (not illustrated).

As the thickness of the polymer substrate 110 is reduced, the polymer substrate 110 is light and useful to implement a thin film display, but the polymer substrate 110 should have a thickness enough to maintain the load by the polymer substrate 110 formed by heat treatment. The thickness of the polymer substrate 110 may be about 10 to about 200 μm, in the case where the glass plate is separated in a thickness of 10 μm or more, shapes of the layers and the elements formed thereon may be stably maintained by only the formed polymer substrate 110, and when the thickness is about 200 μm or less, the thickness is suitable to implement a thin film type flexible display device.

The polymer substrate 110 is subjected to heat treatment (annealing) at a temperature of about 150 to about 550° C. to be formed, and the heat treatment may be performed at a single temperature within the aforementioned temperature range, or may be performed while the temperature is changed within the aforementioned temperature range. For example, the heat treatment may be performed at a temperature of about 150 to about 550° C. for about 5 min to about 5 hours.

The oxide transparent electrode layer (TCO) 112 is laminated on the polymer substrate 110 to absorb heat generated by laser light or a laser passing through an amorphous silicon layer, thus preventing a damage to the polymer substrate 110 having low heat resistance, when amorphous silicon (a-Si) is converted into polysilicon (poly-Si) by using the ELA (excimer laser annealing) process.

The oxide transparent electrode layer 112 may include any one of ITO (indium tin oxide), IGZO (indium gallium zinc oxide), ZnO, graphene, and CNT (carbon nanotube). These materials may absorb or emit light or heat by a laser having a wavelength of about 308 nm, which may be used in the ELA process to prevent damage by the laser of the polymer substrate 110.

The barrier layer 111 may be formed on the oxide transparent electrode layer 112, and the barrier layer 111 may include an inorganic material such as SiOx, SiNx, SiON, AlO, and AlON or an organic material such as acryl or polyimide, or the organic material and the inorganic material may be alternately laminated to form the barrier layer.

The barrier layer 111 serves to block oxygen and moisture and, simultaneously, prevent diffusion of moisture or an impurity generated in the polymer substrate 110 or adjust a heat transfer speed during crystallization, thus allowing crystallization of a semiconductor to be performed well.

The barrier layer 111 may include one or more layers between the semiconductor layer 151a and the polymer substrate 110, and formation positions between the oxide transparent electrode layer 112 and the barrier layer 111 may be varied.

The barrier layer 111 may be formed on an upper portion or a lower portion of the oxide transparent electrode layer 112, and may be formed on all of the upper portion and the lower portion of the oxide transparent electrode layer 112.

The semiconductor layer 151a may include polysilicon, and in this case, a predetermined region may be doped with the impurity.

Generally, the semiconductor layer 151a forms amorphous silicon and crystallizes amorphous silicon to convert amorphous silicon into polysilicon, and various methods such as a RTA (rapid thermal annealing) process, a SPC (solid phase crystallization) method, an ELA (excimer laser annealing) method, a MIC (metal induced crystallization), a MILC (metal induced lateral crystallization) method, or a SLS (sequential lateral solidification) method may be applied as a crystallization method.

Among the crystallization methods, in the case of the ELA method, since the ELA method is already applied as a mass-production process to be used, generally, in the case of a device including a flexible organic light emitting element display, the crystallization method through the ELA method is used. In the ELA method, hydrogen content of the amorphous silicon layer is reduced to a level of about 10% or less. In the case where the hydrogen content of the amorphous silicon layer is high, hydrogen is generated when a laser beam is radiated for crystallization to reduce a characteristic of polysilicon, thus precluding manufacturing of the thin film transistor having an excellent characteristic.

A process of reducing the hydrogen content of the amorphous silicon layer through the heat treatment is performed, and a substrate material for the flexible display generally does not endure a condition of a process performed at about 400° C. or more over a long period of time and generates a large amount of outgas to contaminate the substrate and equipment and generate vapors in the substrate, thus making it difficult to manufacture the display. Further, in the case of the thin film transistor including polysilicon, doping of the impurity and an activation process thereof are used, and in the case of a general ELA-based thin film transistor, an activation temperature of 400° C. or more is typically used.

This process temperature generally cannot be endured by substrates, and it is very difficult to manufacture the polysilicon thin film transistor using the dehydrogenation process and the activation process using the polymer substrate because of the dehydrogenation process and the activation process. The polysilicon thin film transistor is used in order to commercialize the flexible display, and the dehydrogenation process and the like are included in order to manufacture the polysilicon thin film transistor.

The thin film transistor according to an embodiment includes the polymer substrate 110 having excellent heat resistance as described above, and thus the dehydrogenation process can be used at a temperature of about 420 to about 550° C.

For example, in formation of the semiconductor layer 151a, the polysilicon thin film transistor can be manufactured by, after forming the oxide transparent electrode layer 112 and the barrier layer 111 on the polymer substrate 110, forming amorphous silicon as the semiconductor layer 151a on the barrier layer 111, performing dehydrogenation treatment of amorphous silicon at a temperature of about 420 to 550° C., and radiating the laser beam on the dehydrogenated silicon layer to perform crystallization.

Hereinafter, a method of manufacturing the polysilicon thin film transistor according to an embodiment will be described in detail with reference to FIGS. 2 to 4.

Figure 2:
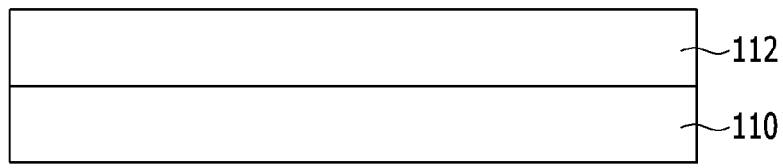
FIG. 2 is a cross-section of an oxide transparent electrode layer deposited on a polymer substrate during a process of manufacturing the thin film transistor substrate according to an embodiment.
Figure 3:
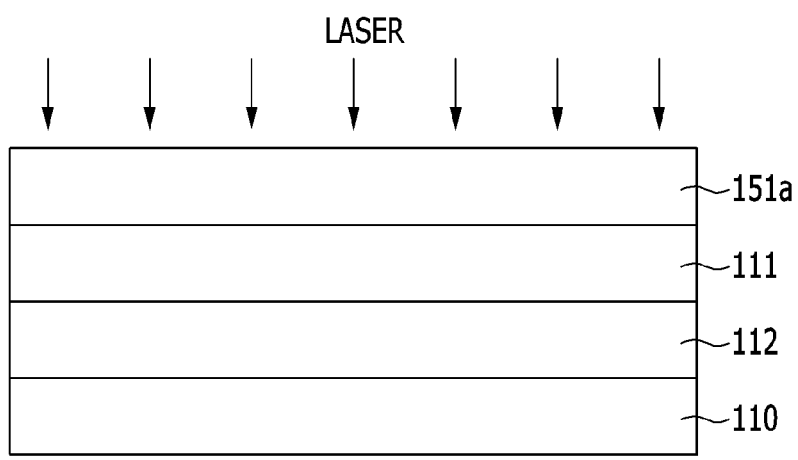
FIG. 3 illustrates an ELA process for manufacturing an amorphous silicon-based thin film transistor substrate into a polysilicon thin film transistor substrate according to an embodiment.
Figure 4:
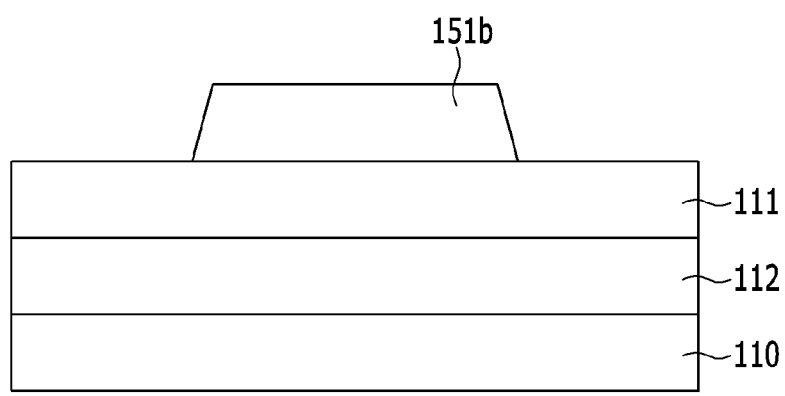
FIG. 4 is a cross-section of the polysilicon thin film transistor substrate according to an embodiment.

FIG. 2 is a cross-section of the oxide transparent electrode layer 112 deposited on the polymer substrate 110 during a process of manufacturing the thin film transistor substrate according to an embodiment, FIG. 3 illustrates the ELA process for manufacturing the amorphous silicon-based thin film transistor substrate into the polysilicon thin film transistor substrate, and FIG. 4 is a cross-section of the polysilicon thin film transistor substrate.

Referring to FIG. 2, first, the polymer substrate 110 is manufactured, and the polymer substrate 110 may be formed by the manner of applying, for example, the polymer resin solution on the glass plate (not illustrated).

As the thickness of the polymer substrate 110 is reduced, the polymer substrate 110 is light and useful to implement the thin film display. The polymer substrate 110 has a thickness enough to maintain the load by the polymer substrate 110 formed by heat treatment. The thickness of the polymer substrate 110 may be about 10 to about 200 μm, in the case where the glass plate is separated in a thickness of about 10 μm or more, shapes of the layers and the elements formed thereon may be stably maintained by only the formed polymer substrate 110, and when the thickness is 200 μm or less, the thickness is suitable to implement the thin film type flexible display device.

The polymer substrate 110 is formed by being subjected to heat treatment (annealing) at a temperature of about 150 to about 550° C., and, the heat treatment may be performed at a single temperature within the aforementioned temperature range, or may be performed while the temperature is changed within the aforementioned temperature range. For example, the heat treatment may be performed at a temperature of about 150 to about 550° C. for about 5 min to about 5 hours.

The oxide transparent electrode layer 112 is formed on the polymer substrate 110, and the oxide transparent electrode layer 112 may include any one of ITO (indium tin oxide), IGZO (indium gallium zinc oxide), ZnO, graphene, or CNT (carbon nanotube).

Referring to FIG. 3, silicon is polycrystallized by forming the barrier layer 111 on the oxide transparent electrode layer 112, forming amorphous silicon as the semiconductor layer 151a on the barrier layer 111, performing dehydrogenation treatment of amorphous silicon at a temperature of about 420 to 550° C., and radiating the laser beam on the dehydrogenated silicon layer.

For the laser beam, a pulse manner where energy is not continuously applied to the amorphous silicon layer but energy is applied for a predetermined time is used, and application of energy for a predetermined time is called a shot. In this case, the amorphous silicon layer is crystallized into the polysilicon layer by using the shot, and the amorphous silicon layer may be moved to a next radiation region after one shot of the laser beam is radiated and can also be moved to the next radiation region after a plurality of shots of the laser beam is radiated. In one embodiment, the laser beam has an energy density of about 100 to 1,000 mJ/cm$^2$, is radiated for about 10 to 40 ns, and is generated from a XeCl excimer laser having a wavelength of about 308 nm.

The dehydrogenation treatment by the laser beam reduces the hydrogen content of amorphous silicon, and, for example, may reduce the hydrogen content to 10% or less. In the case where the hydrogen content of amorphous silicon satisfies the aforementioned range, when the laser beam is radiated for crystallization, hydrogen is not generated, and thus the thin film transistor having excellent characteristics may be manufactured.

After the crystallization process into the polysilicon layer is performed, a portion of the polysilicon layer is etched and then subjected to a process of patterning the polysilicon layer.

Referring to FIG. 4, after the polycrystallization process is performed through the ELA process, the semiconductor layer 151b where patterned silicon is formed may be confirmed.

Hereinafter, a thin film transistor array panel according to an embodiment will be described in detail with reference to FIG. 5.

Figure 5:
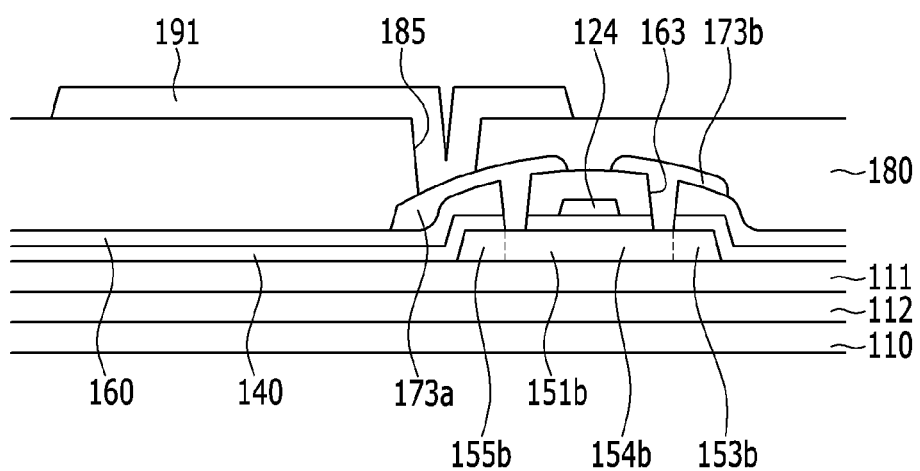
FIG. 5 is a cross-section of a portion of a polysilicon thin film transistor array panel according to an embodiment.

FIG. 5 is a cross-section of a portion of a polysilicon thin film transistor array panel according to an embodiment.

First, as described above, the oxide transparent electrode layer 112 is formed on the polymer substrate 110 as the thin film transistor substrate, and after the barrier layer 111 is formed on the oxide transparent electrode layer 112, the semiconductor layer formed of amorphous silicon forms the semiconductor layer 151b formed of polysilicon through the laser process.

In the semiconductor layer 151b, an impurity region includes source and drain regions 153b and 155b, which are doped with the impurity and are separated from each other. An intrinsic region may include a channel region 154b positioned between the source and drain regions 153b and 155b, and a storage region longitudinally upwardly extending from the source region 153b and the drain region 155b.

A gate insulating layer 140 is formed between the semiconductor layer 151b and a gate electrode 124 in order to insulate a space between the semiconductor layer 151b and the gate electrode 124. The gate insulating layer 140 may be made of a silicon-based insulating material, and tetraethyl orthosilicate (TEOS) or silane may be used as a precursor of the silicon-based insulating material.

The gate electrode 124 may include various conductive materials. For example, the gate electrode 124 may include a material such as Mg, Al, Ni, Cr, Mo, W, MoW, Au, or the like. Numerous variations are feasible, for example, the gate electrode 124 may be formed in a shape of a plurality of layers as well as a single layer.

An interlayer insulating layer 160 may include a silicon-based insulating material, and may include an insulating organic material or the like. A contact hole 163 through which the source and drain regions are exposed may be formed by selectively removing the interlayer insulating layer 160 and the gate insulating layer 140. In addition, the source and drain electrodes 173a and 173b are formed of the aforementioned material for the gate electrode 124 in a shape of a single layer or a plurality of layers on the interlayer insulating layer 160 so that the contact hole 163 is buried.

A passivation layer (and/or planarization layer) 180 is provided on upper portions of the source and drain electrodes 173a and 173b to protect and planarize the thin film transistor at lower portions. The passivation layer 180 may be constituted in various shapes, and may include an organic material such as BCB (benzocyclobutene) or acryl, or an inorganic material such as SiNx, and numerous variations are feasible, for example, the passivation layer may be constituted by a single layer, double layers, or multiple layers.

Next, the flexible display device where a display element is formed on an upper portion of the thin film transistor will be described in detail with reference to FIG. 6.

Figure 6:
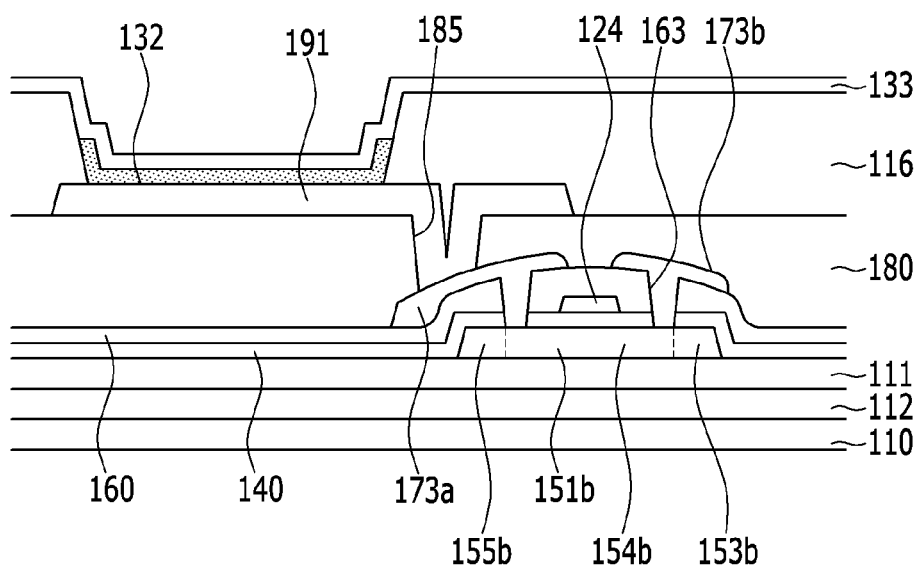
FIG. 6 is a cross-section of an organic light emitting diode display including a polysilicon thin film transistor according to an embodiment.

FIG. 6 is a cross-section of an organic light emitting diode display including the polysilicon thin film transistor according to an embodiment.

The flexible display device includes the thin film transistor having the aforementioned characteristic and the display element formed to be electrically connected to the thin film transistor on the thin film transistor.

The display element is exemplified by the organic light emitting element, but is not limited thereto, and various display elements may be applied.

In order to form the organic light emitting element on the upper portion of the thin film transistor, first, electric connection to a first electrode 191 is obtained by forming a contact hole 185 in one electrode of the source electrode or the drain electrode.

The first electrode 191 acts as one electrode among the electrodes provided to the organic light emitting element later, and may include various conductive materials. The first electrode 191 may be formed as a transparent electrode or a reflection type electrode according to the organic light emitting element as will be formed later. When the first electrode 191 is used as the transparent electrode, the first electrode 191 may include ITO, IZO, ZnO, or In$_2$O$_3$, and when the first electrode 191 is used as the reflection type electrode, after a reflection layer is formed of Ag, Mg, Al, Pt, Pd, Au, Ni, Nd, Ir, Cr, a compound thereof, or the like, ITO, IZO, ZnO, or In$_2$O$_3$ may be formed thereon.

Next, as illustrated in FIG. 6, the organic light emitting element is formed, in which a pixel definition layer 116 patterned by an insulating material is formed on the first electrode 191, to expose at least a portion of the first electrode 191. Subsequently, an intermediate layer 132 including a light emitting layer is formed on an exposed portion of the first electrode 191, and a second electrode 133 is formed on the intermediate layer 132 to face the first electrode 191.

FIG. 6 illustrates that the intermediate layer 132 is patterned to correspond to only each subpixel, that is, each patterned first electrode 191, but this is illustrated for convenience in order to explain constitution of the subpixel, and, the intermediate layer 132 may be integrally formed with the intermediate layer 132 of the adjacent subpixel. Further, numerous variations are feasible, for example, the layer of a portion of the intermediate layer 132 may be formed for each subpixel, and the other layer may be integrally formed with the intermediate layer 132 of the adjacent subpixel.

The intermediate layer 132 may be provided with a low molecular or polymer organic material. In the case where the low molecular organic material is used, a hole injection layer (HIL), a hole transport layer (HTL), an organic emissive layer (EML), an electron transport layer (ETL), an electron injection layer (EIL), and the like may be formed to be laminated in a single or complex structure, and various available organic materials such as copper phthalocyanine (CuPc), N,N'-di (naphthalene-1-yl)-N,N'-diphenyl-benzidine (NPB), and tris-8-hydroxyquinoline aluminum (Alq3) may be applied. The low molecular organic materials may be formed by a method such as vacuum deposition using masks.

In the case of the polymer organic material, the polymer organic material may generally have a structure provided with the hole transport layer (HTL) and the organic emissive layer (EML), and in this case, the hole transport layer may be formed using PEDOT and the organic emissive layer may be formed using polymer organic materials such as PPVs (polyphenylenevinylene) and polyfluorenes by screen printing, an inkjet printing method, or the like.

Like the first electrode 191, the second electrode 133 may be provided with the transparent electrode or the reflection type electrode, and when the second electrode 133 is used as the transparent electrode, the second electrode 133 may be provided with a layer formed of Li, Ca, LiF/Ca, LiF/Al, Al, Mg, or a compound thereof and an auxiliary electrode or a bus electrode line formed of a material for forming the transparent electrode, such as ITO, IZO, ZnO, or $In_2O_3$ on the layer. In addition, when the second electrode 133 is used as the reflection type electrode, the second electrode 133 is formed by depositing Li, Ca, LiF/Ca, LiF/Al, Al, Mg, or a compound thereof on an entire surface.

Next, although not illustrated in the drawings, a sealing member may be provided.

As described above, a polysilicon thin film transistor according to embodiments provide an oxide transparent electrode layer (TCO) which may absorb heat energy and light generated during a process of manufacturing the polysilicon thin film transistor to prevent a damage of the substrate using a polymer material.

While this invention has been described in connection with certain embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor substrate comprising:
   a polymer substrate;
   an oxide transparent electrode layer (TCO) disposed between an entire surface of the polymer substrate and at least one barrier layer; and
   a semiconductor layer disposed on the at least one barrier layer,
   wherein the semiconductor layer comprises polysilicon,
   wherein the oxide transparent electrode layer (TCO) overlaps with the semiconductor layer.

2. The thin film transistor substrate of claim 1, wherein:
   the polymer substrate includes at least one of PC (polycarbonate), PET (polyethylene terephthalate), PEN (polyethylene naphthalate), PES (polyether sulfone), PMMA (polymethyl methacrylate), PAR (polyarylate), or PI (polyimide).

3. The thin film transistor substrate of claim 2, wherein:
   the polymer substrate is applied on a glass plate.

4. The thin film transistor substrate of claim 2, wherein:
   a thickness of the polymer substrate is about 10 to about 200 μm.

5. The thin film transistor substrate of claim 2, wherein:
   the oxide transparent electrode layer (TCO) includes at least one of ITO (indium tin oxide), IGZO (indium gallium zinc oxide), ZnO, graphene, or CNT (carbon nanotube).

6. The thin film transistor substrate of claim 5, wherein:
   the oxide transparent electrode layer (TCO) is configured to absorb light and heat by a laser.

7. A method of manufacturing the thin film transistor substrate of claim 1, comprising:
   applying the polymer substrate on a support;
   depositing the oxide transparent electrode layer on the polymer substrate;
   depositing the at least one barrier layer on the oxide transparent electrode layer;
   forming amorphous silicon as the semiconductor layer on the at least one barrier layer; and
   performing dehydrogenation treatment of the amorphous silicon and radiating a laser beam thereon.

8. The method of manufacturing a thin film transistor substrate of claim 7, wherein:
   the polymer substrate includes at least one of PC (polycarbonate), PET (polyethylene terephthalate), PEN (polyethylene naphthalate), PES (polyether sulfone), PMMA (polymethyl methacrylate), PAR (polyarylate), or PI (polyimide).

9. The method of manufacturing a thin film transistor substrate of claim 8, wherein:
   the oxide transparent electrode layer (TCO) includes at least one of ITO (indium tin oxide), IGZO (indium gallium zinc oxide), ZnO, graphene, or CNT (carbon nanotube).

10. The method of manufacturing a thin film transistor substrate of claim 9, wherein:
    the dehydrogenation treatment is performed at a temperature of about 420 to about 550° C.

11. The method of manufacturing a thin film transistor substrate of claim 9, wherein:
    radiating a laser beam includes using an excimer laser.

12. An organic light emitting diode display comprising:
    a polymer substrate;
    an oxide transparent electrode layer (TCO) disposed between an entire surface of the polymer substrate and a thin film transistor;
    a passivation layer disposed on the thin film transistor;
    a first electrode disposed on the passivation layer;
    an intermediate layer disposed on the first electrode; and
    a second electrode disposed on the intermediate layer
    wherein the oxide transparent electrode layer (TCO) overlaps with the semiconductor layer.

13. The organic light emitting diode display of claim 12, wherein:
    the polymer substrate includes at least one of PC (polycarbonate), PET (polyethylene terephthalate), PEN (polyethylene naphthalate), PES (polyether sulfone), PMMA (polymethyl methacrylate), PAR (polyarylate), or PI (polyimide).

14. The organic light emitting diode display of claim 13, wherein:
    the oxide transparent electrode layer (TCO) includes at least one of ITO (indium tin oxide), IGZO (indium gallium zinc oxide), ZnO, graphene, and CNT (carbon nanotube).

* * * * *